United States Patent
Naijo

(10) Patent No.: US 9,118,016 B2
(45) Date of Patent: Aug. 25, 2015

(54) ORGANIC LIGHT EMITTING DIODE DISPLAY AND MANUFACTURING METHOD THEREOF

(71) Applicant: Samsung Display Co., Ltd., Yongin, Gyeonggi-Do (KR)

(72) Inventor: Tsuyoshi Naijo, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/206,410

(22) Filed: Mar. 12, 2014

(65) Prior Publication Data

US 2014/0264299 A1    Sep. 18, 2014

(30) Foreign Application Priority Data

Mar. 13, 2013    (KR) .................. 10-2013-0026784

(51) Int. Cl.
 H01L 51/50    (2006.01)
 H01L 51/56    (2006.01)
 H01L 51/00    (2006.01)

(52) U.S. Cl.
 CPC ........ H01L 51/0017 (2013.01); H01L 51/0026 (2013.01); H01L 51/5068 (2013.01); H01L 51/5084 (2013.01); H01L 51/5088 (2013.01); H01L 51/56 (2013.01)

(58) Field of Classification Search
 CPC .................. H01L 51/5068; H01L 51/5084
 See application file for complete search history.

(56) References Cited

U.S. PATENT DOCUMENTS

| | | | | |
|---|---|---|---|---|
| 7,456,566 B2 * | 11/2008 | Seo et al. | | 313/504 |
| 2003/0044516 A1 * | 3/2003 | Nishikawa et al. | | 427/66 |
| 2005/0093432 A1 * | 5/2005 | Yamazaki et al. | | 313/503 |
| 2008/0111484 A1 * | 5/2008 | Kwon et al. | | 313/506 |
| 2009/0153033 A1 * | 6/2009 | Lee et al. | | 313/504 |

FOREIGN PATENT DOCUMENTS

| | | |
|---|---|---|
| JP | 2009-283491 A | 12/2009 |
| JP | 2011-124199 A | 6/2011 |
| KR | 10-2006-0090485 B1 | 8/2006 |
| KR | 10-2008-0001184 A | 1/2008 |

* cited by examiner

Primary Examiner — Stephen W Smoot
(74) Attorney, Agent, or Firm — Lee & Morse, P.C.

(57) ABSTRACT

A method of manufacturing an organic light emitting diode (OLED) display includes forming a thin film transistor on a substrate; forming a first electrode electrically connected with the thin film transistor; forming a hole auxiliary layer on the first electrode; depositing an organic material on the hole auxiliary layer using a mask having an opening corresponding to the first electrode; forming an organic emission layer by partially eliminating the organic material through dry-etching, the dry-etching being performed to eliminate the organic material deposited outside of a boundary of the first electrode; forming an electron auxiliary layer on the organic emission layer; and forming a second electrode on the electron auxiliary layer.

8 Claims, 9 Drawing Sheets

ORGANIC LIGHT EMITTING DIODE DISPLAY AND MANUFACTURING METHOD THEREOF

RELATED APPLICATIONS

This application claims the benefit of and priority under 35 U.S.C. §119 to Korean Patent Application No. 10-2013-0026784, filed on Mar. 13, 2013, in the Korean Intellectual Property Office, and entitled: "ORGANIC LIGHT EMITTING DIODE DISPLAY AND MANUFACTURING METHOD THEREOF," which is incorporated by reference herein in its entirety.

BACKGROUND

1. Field

Embodiments relate to an organic light emitting diode (OLED) display and a manufacturing method thereof.

2. Description of the Related Art

An organic light emitting diode (OLED) display may include two electrodes and an organic emission layer disposed between the two electrodes. Electrons injected from one electrode and holes injected from the other electrode may be combined in the organic emission layer such that excitons are formed, and light may be emitted by energy generated from the excitons.

The above information disclosed in this Background section is only for enhancement of understanding of the background of the described technology and therefore it may contain information that does not form the prior art that is already known in this country to a person of skill in the art.

SUMMARY

Embodiments relate to a method of manufacturing an organic light emitting diode (OLED) display, the method including forming a thin film transistor on a substrate; forming a first electrode electrically connected with the thin film transistor; forming a hole auxiliary layer on the first electrode; depositing an organic material on the hole auxiliary layer using a mask having an opening corresponding to the first electrode; forming an organic emission layer by partially eliminating the organic material through dry-etching, the dry-etching being performed to eliminate the organic material deposited outside of a boundary of the first electrode; forming an electron auxiliary layer on the organic emission layer; and forming a second electrode on the electron auxiliary layer.

The method may further include, after the forming of the organic emission layer, performing heat treatment at a temperature higher than a softening temperature of the hole auxiliary layer and lower than a softening temperature of the organic emission layer.

The method may further include, after the forming of the electron auxiliary layer, performing heat treatment at a temperature higher than a softening temperature of the electron auxiliary layer and lower than a softening temperature of the organic emission layer.

The method may further include, after the forming of the electron auxiliary layer, performing heat treatment at a temperature higher than a softening temperature of the electron auxiliary layer and lower than a softening temperature of the organic emission layer.

The organic emission layer may include a plurality of sub-emission layers respectively having different light emission colors, and the depositing of the organic material and the forming of the organic emission layer may be iteratively performed fore each color of the sub-emission layers.

The colors of the sub-emission layers may include red, green, and blue.

The dry-etching may be performed until the hole auxiliary layer is exposed outside of the boundary of the first electrode.

Embodiments are also directed to an organic light emitting diode (OLED) display, including a substrate; a thin film transistor disposed on the substrate; a first electrode electrically connected with the thin film transistor; a hole auxiliary layer disposed on the first electrode; an organic emission layer disposed on the hole auxiliary layer; an electron auxiliary layer disposed on the organic emission layer; and a second electrode disposed on the electron auxiliary layer. A surface roughness of the organic emission layer contacting the electron auxiliary layer may be greater than that of the hole auxiliary layer contacting the electron auxiliary layer.

BRIEF DESCRIPTION OF THE DRAWINGS

Features will become apparent to those of skill in the art by describing in detail example embodiments with reference to the attached drawings in which.

DETAILED DESCRIPTION

Figure 1:
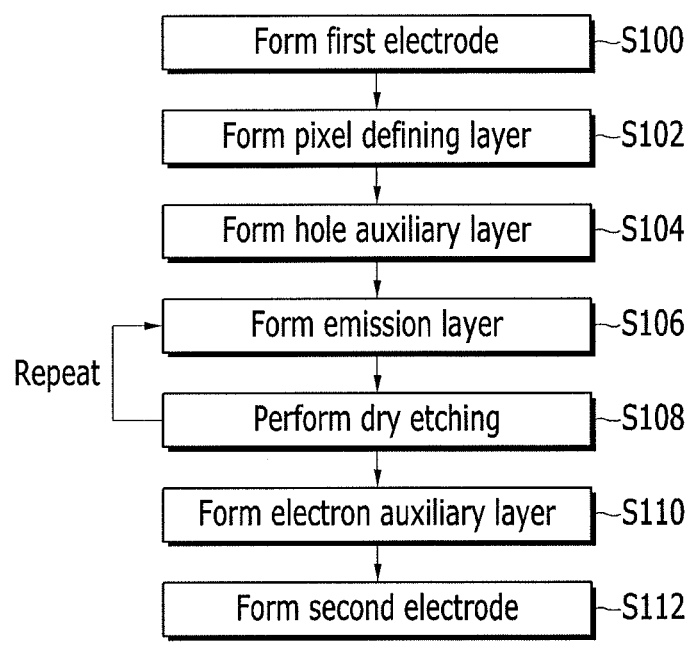
FIG. 1 is a flowchart provided for description of a manufacturing method of an OLED display according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. In the drawing figures, dimensions may be exaggerated for clarity of illustration. Like reference numerals refer to like elements throughout.

A method of manufacturing an organic light emitting diode display according to an example embodiment will be described in detail with reference to the drawings.

FIG. 1 is a flowchart provided for description of a method of manufacturing an organic light emitting diode (OLED) display according to an example embodiment.

As shown in FIG. 1, a manufacturing method of an OLED display according to the present example embodiment includes forming a first electrode on a substrate (S100), forming a pixel defining layer on the first electrode (S102), forming a hole auxiliary layer (S104), forming an emission layer (S106), dry-etching (S108), forming an electron auxiliary layer (S110), and forming a second electrode (S112).

In further detail, the manufacturing method of the OLED display will be described in further detail with reference to FIG. 1, FIG. 2, and FIG. 6.

FIG. 2 to FIG. 6 are cross-sectional views sequentially illustrating a manufacturing process of the OLED display according to the example embodiment.

Figure 2:
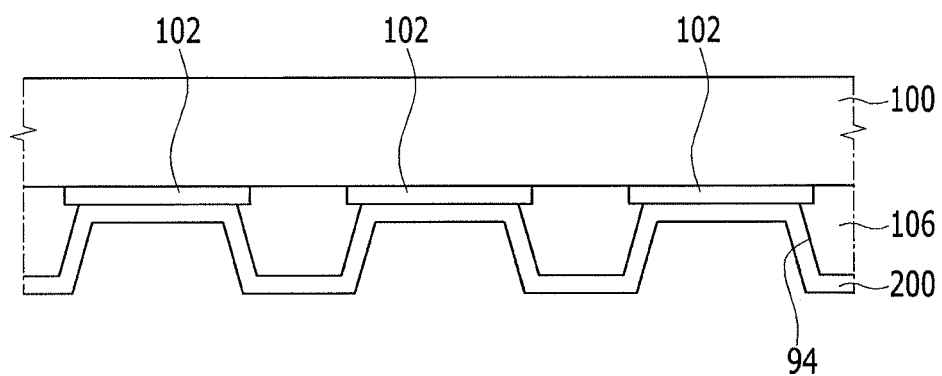
FIG. 2 to FIG. 6 are cross-sectional views sequentially illustrating a manufacturing process of the OLED display according to the example embodiment.

First, as shown in FIG. 1 and FIG. 2, a substrate 100 is prepared and a plurality of first electrodes 102 are formed on the substrate (S100).

The substrate 100 may be made of a metal substrate or a transparent glass substrate, or may be a flexible polymer substrate. The polymer substrate may be an organic material selected from a group of insulating organic materials, such as polyethersulphone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), triacetylcellulose (TAC), and cellulose acetate propionate (CAP).

The substrate 100 may include a thin film transistor array (not shown) including a plurality of driving transistors, a plurality of signal lines, and a plurality of switching transistors.

The first electrode 102 may be formed of a transparent electrode or a reflective electrode, and when the first electrode 102 is formed of the transparent electrode, ITO, IZO, ZnO, or $In_2O_3$ may be included, and when the first electrode 102 is formed of the reflective electrode Ag, Mg, Al, Pt, Pd, Au, Ni, Nd, Ir, Cr, or a compound thereof are formed as a reflective layer and then a layer may be formed of ITO, IZO, ZnO, or $In_2O_3$.

Then, a pixel defining layer 104 is formed on the substrate 100 (S102). The pixel defining layer 104 defines an emission area where the emission layer is formed, and includes an opening 94 exposing the first electrode 102.

The pixel defining layer 104 may be formed by depositing various insulation materials such as polyimide, silicon nitride, or silicon oxide.

Next, a hole auxiliary layer 200 is formed on the pixel defining layer 104 and the first electrode 102 (S104). The hole auxiliary layer 200 may include one or more of a hole injection layer (HIL) and a hole transport layer (HTL).

The hole injection layer may be formed of copper phthalocyanine (CuPc), N,N'-diphenyl-N,N'-di-[4-(N,N-ditolyl-amino)phenyl]benzidine (NTNPB), (poly 3 and 4-ethylene-dioxythiophene) (PEDOT), polyaniline (PANI), or N,N'-diphenyl-N,N'-di-[4-(N,N-diphenyl-amino)phenyl] benzidine (NPNPB), but it is not limited thereto.

The hole transport layer may be formed of N,N-dinaphthyl-N,N'-diphenyl benzidine (NPD), 4,4',4"-tris(N-3-methylphenyl-N-phenyl-amino)-triphenylamine (MTDATA), N,N'-bis(naphthalen-1-yl]-N,N'-bis(phenyl)-benzidine (NPB), or N,N'-bis(3-methylphenyl)-N,N'-bis(phenyl) (TPD), but it is not limited thereto.

Figure 3:
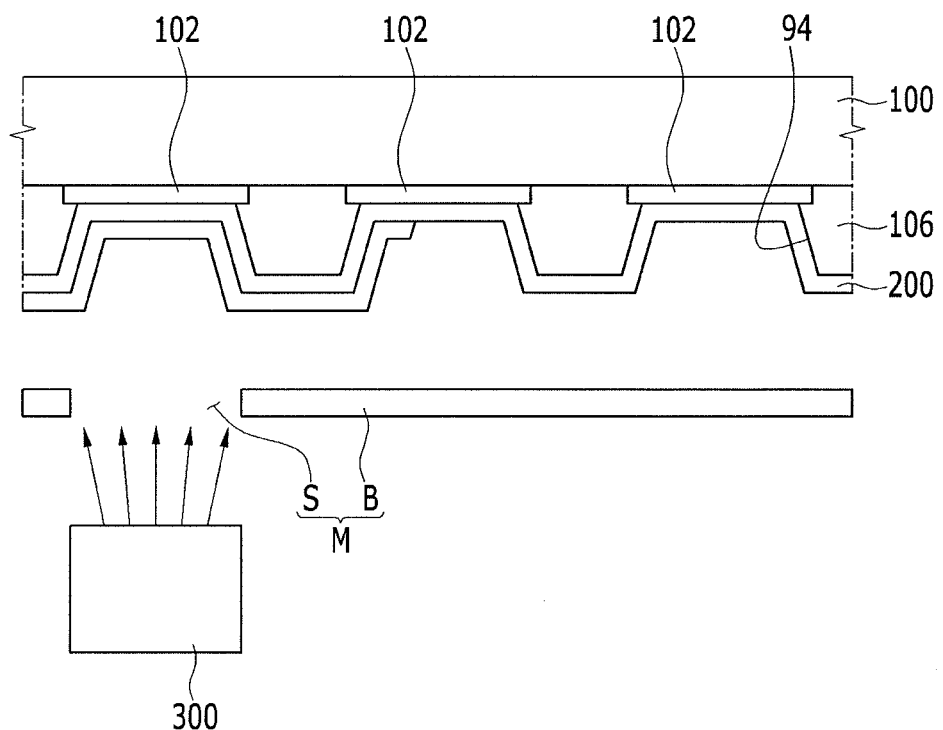

Then, as shown in FIG. 1 and FIG. 3, an organic emission layer is formed by depositing an organic material on the hole auxiliary layer 200 (S106).

The OLED display according to the present example embodiment may include a red pixel, a green pixel, and a blue pixel, and the organic emission layer may be a red emission layer, a green emission layer, or a blue emission layer depending on each pixel. However, the OLED display is not limited thereto, and the organic emission layer may include a white emission layer.

Hereinafter, for convenience of description, a red emission layer, a green emission layer, and a blue emission layer are sequentially formed in the following description. However, the present example embodiment is not limited thereto, and an order for forming the respective emission layers may be variously modified.

A red emission layer 202R may be formed using a deposition source 300 containing an organic material for emission of red light and a mask M having a slit S.

In further detail, the slit S of the mask M is disposed to be corresponding to the first electrode 102 of the red pixel, while other pixels are disposed to be corresponding to a block portion B of the mask M. Then, the deposition source 300 is heated to irradiate the organic material therein to the first electrode 102 to thereby form the red emission layer 202R.

In this case, the irradiated organic material may be deposited not only to the first electrode 102 of the red pixel but also to neighboring pixels, which are the green pixel and the blue pixel, e.g., if the irradiated organic material is deposited to the neighboring pixels through a gap between the substrate 100 and the mask M.

Figure 4:
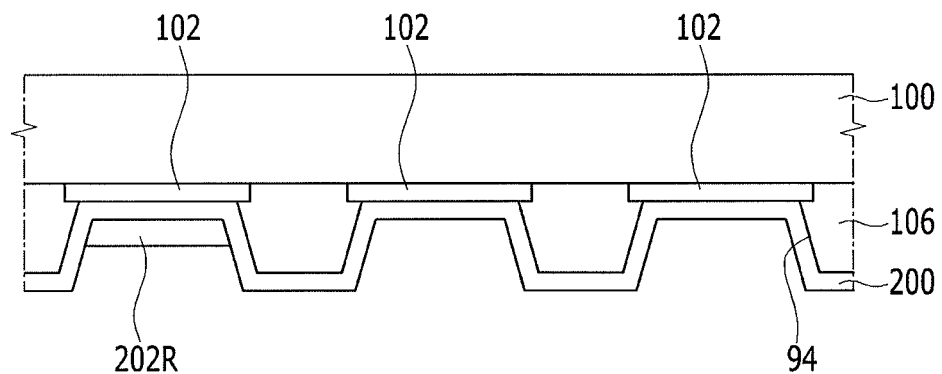

Next, as shown in FIG. 1 and FIG. 4, the red organic emission layer is partially eliminated through dry-etching (S108) with elimination of the mask.

The dry-etching is performed to eliminate the red organic materials deposited to the neighboring pixels during the deposition process as shown in FIG. 3, and the dry-etching is continued until a hole auxiliary of each of the neighboring pixels, excluding the red pixel, is exposed to thereby eliminate all the deposited red organic materials.

In this case, an upper portion of the red emission layer of the red pixel may be partially eliminated. Therefore the red emission layer may be initially formed to be thicker than the target thickness of the red emission layer to be formed, to account for the thickness of the organic material that is eliminated from the red emission layer through the dry-etching.

Figure 5:
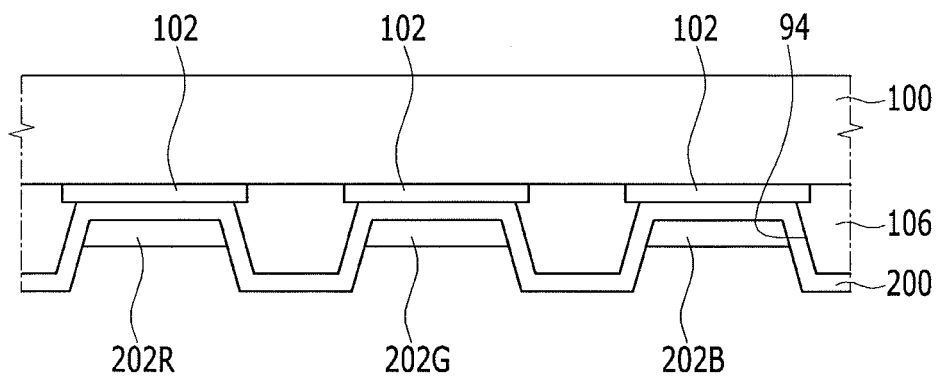

Next, as shown in FIG. 1 and FIG. 5, a green emission layer 202G and a blue emission layer 202B are formed. The green emission layer 202G and the blue emission layer 202B may be formed by repeating the process shown in FIG. 3 and FIG. 4.

Thus, a green emission organic material is deposited to the green pixel using a mask having a slit corresponding to the first electrode of the green pixel and dry-etching is performed to form a green emission layer, and a blue emission organic material is deposited to the blue pixel using a mask having a slit that corresponds to the first electrode of the blue pixel and dry-etching is performed to a blue emission layer.

The red emission layer, the green emission layer, and the blue emission layer may include a phosphorescent host, a phosphorous host, a phosphorescent dopant, and/or a phosphorous dopant.

As such a host, (4,4'-bis(carbazol-9-yl)biphenyl) (CBP), (9,10-di(naphth-2-yl) anthracene) (ADN), 1,3,5-tris(N-phenylbenzimidazole-2-yl)benzene (TPBI), 2-tert-butyl-9,10-di (2-naphthyl)anthracene (TBADN), 1,3-bis(carbazol-9-yl) benzene (MCP), or 1,3,5-tris(carbazol-9-yl)benzene (TCP) may be used, but it is not limited thereto.

As a red dopant, Pt(II) octaethylporphine (PtOEP), tris(1-phenylisoquinoline) iridium(III) (Ir(piq)3), or bis(2-benzo[b] thiophen-2-yl-pyridine(Ir(btp)2(acac)) may be used, as a green dopant, tris(2-phenylpyridine)iridium ($Ir(ppy)_3$), or acetylacetonatobis(2-phenylpyridine)iridium (Ir(ppy)2 (acac)) may be used, and as a blue dopant, bis[2-(4,6-difluorophenyl)pyridinato-N,C2']iridium picolinate (F2Irpic), (F2 ppy)$_2$Ir(tmd), tris[1-(4,6-difluorophenyl)pyrazolate-N,C2'] iridium) ($Ir(dfppz)_3$), 4,4'-bis(2,2-diphenylvinyl)-1,1'-biphenyl) (DPVBi), 4,4-Bis[4-(di-p-tolylamino)styryl]biphenyl (DPAVBi), or 2,5,8,11-tetra-tert-butylperylene (TBPe) may be used, but it is not limited thereto.

As described, when the organic material is deposited to form the emission layer and the dry-etching is performed as in the present example embodiment, the emission organic material of a pixel to be formed may be prevented from being mixed with other emission material of neighboring pixels due to deposition of the emission organic material to the neighboring pixels.

Figure 6:
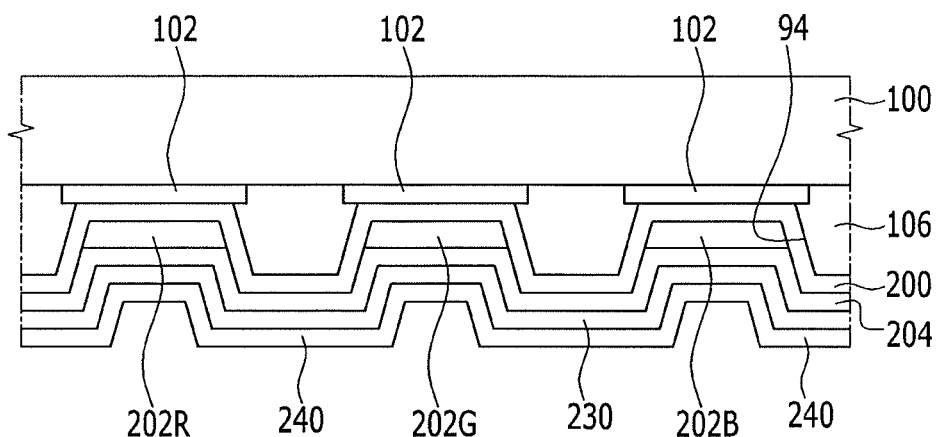

Next, as shown in FIG. 1 and FIG. 6, the electron auxiliary layer 204 is formed on the organic emission layers 202R, 202G, and 202B (S110). The electron auxiliary layer 204 may include one or more of an electron transport layer (ETL), an electron injection layer (EIL), and a hole blocking layer (HBL).

The electron transport layer (ETL) and the electron injection layer (EIL) may be formed by including at least one of Alq3 (tris(8-hydroxyquinolino)aluminum), PBD, TAZ, spiro-PBD, BAlq, SAlq, 2,9-dimethyl-4,7-diphenyl-1,10-phenanthroline (BCP), and 4,7-diphenyl-1,10-phenanthroline (Bphen), but it is not limited thereto.

After forming the second electrode 230 on the electron auxiliary layer 204 (S112), an encapsulation layer 240 is formed. The encapsulation layer 240 may be formed by alternately layering at least one organic layer and at least one inorganic layer. The inorganic layer and the organic layer may respectively be provided in plural.

The organic layer is formed of a polymer, and may have a single-layered structure of a multi-layered structure including at least one of polyethylene terephthalate, polyimide, polycarbonate, epoxy, polyethylene, and polyacrylate. For example, the organic layer may be formed of polyacrylate, and may include a polymerized monomer composition including a diacrylate-based monomer and a triacrylate-based monomer. The monomer composition may further include a monoacrylate-based monomer. Further, a photo initiator such as a TPO may further be included in the monomer composition, but it is not limited thereto.

The inorganic layer may have a single-layered or multi-layered structure including a metal oxide or a metal nitride. In further detail, the inorganic layer may include at least one of SiNx, $Al_2O_3$, $SiO_2$, and $TiO_2$.

The uppermost layer of the encapsulation layer 240, exposed to the outside, may be formed as an inorganic layer to help prevent permeation of moisture into an organic light emitting element.

The encapsulation layer 240 may include at least one sandwich structure in which at least one organic layer is interposed between at least two inorganic layers. In another implementation, the encapsulation layer 240 may include at least one sandwich structure in which at least one inorganic layer is interposed between at least two organic layers.

A halogenated metal layer including LiF may be additionally provided between the second electrode 230 and the inorganic layer of the encapsulation layer 240. The halogenated metal layer may help prevent a display unit including the second electrode 230 from being damaged when the inorganic layer is formed through a sputtering method or a plasma deposition method.

The encapsulation layer 240 may be replaced with a metal substrate or an encapsulation substrate such as a glass substrate instead of forming the organic layer and the inorganic layer.

Figure 7:
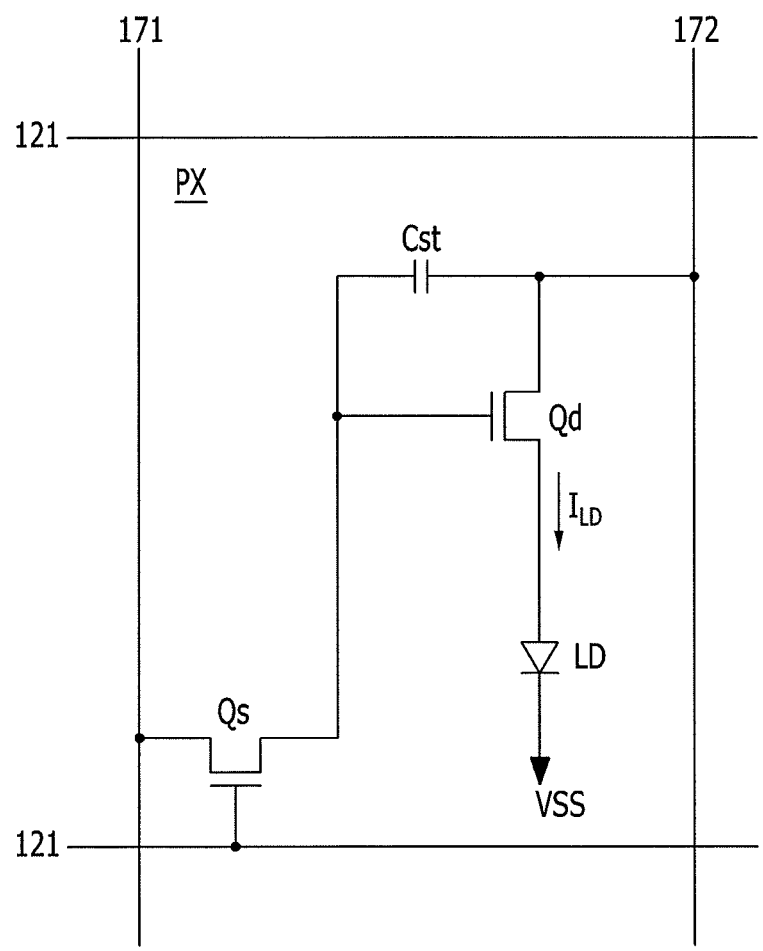
FIG. 7 is an equivalent circuit diagram of the OLED display according to the example embodiment.

With the above-described manufacturing method, the OLED display may have an equivalent circuit diagram shown in FIG. 7.

FIG. 7 is an equivalent circuit diagram of the OLED display according to the example embodiment.

As shown in FIG. 7, the OLED display according to the present example embodiment includes a plurality of signal lines 121, 171, and 172 and a pixel PX connected thereto.

The signal lines include a scanning signal line 121 transmitting a gate signal (or, a scan signal), a data line 171 transmitting a data signal, and a driving voltage line 172 transmitting a driving voltage. Scanning signal lines 121 may be extended substantially in a row direction and substantially parallel with each other, and data lines 171 may be extended substantially in a column direction and substantially parallel with each other. Driving voltage lines 172 may be extended substantially in the column direction (as illustrated), but may be extended in the row direction or arranged in a mesh shape.

In the present example embodiment, each pixel PX includes a switching transistor Qs, a driving transistor Qd, a storage capacitor Cst, and an organic light emitting element LD.

The switching transistor Qs includes a control terminal, an input terminal, and an output terminal, and the control terminal is connected to the scanning signal line 121, the input terminal is connected to a data line 171, and the output terminal is connected to the driving transistor Qd. The switching transistor Qs transmits a data signal received from the data line 171 to the driving transistor Qd in response to a scan signal received from the scanning signal line 121.

The driving transistor Qd also includes a control terminal, an input terminal, and an output terminal, and the control terminal is connected to the switching transistor Qs, the input terminal is connected to the driving voltage line 172, and the output terminal is connected to the organic light emitting element LD. The driving transistor Qd flows an output current $I_{LD}$, the intensity of which is changed depending on a voltage between the control terminal and the output terminal thereof.

The capacitor Cst is connected between the control terminal and the input terminal of the driving transistor Qd. The capacitor Cst charges a data signal applied to the control terminal of the driving transistor Qd and maintains the charged data signal even though the switching transistor Qs is turned off.

As an organic light emitting diode (OLED), the organic light emitting element LD includes, for example, an anode connected to the output terminal of the driving transistor Qd and a cathode connected to a common voltage Vss. The anode may be the first electrode 102 of FIG. 2 and the cathode may be the second electrode 230 of FIG. 2.

The organic light emitting element LD displays light for an image by changing intensity thereof depending on the output current ILD of the driving transistor Qd. The organic light emitting element LD may include an organic emission layer which uniquely emits any one or one or more light of primary colors such as three primary colors of red, green, and blue, and displays light for a desired image in a spatial combination of the colors. The organic emission layer may be formed using the manufacturing method of FIG. 1 to FIG. 6.

Figure 8:
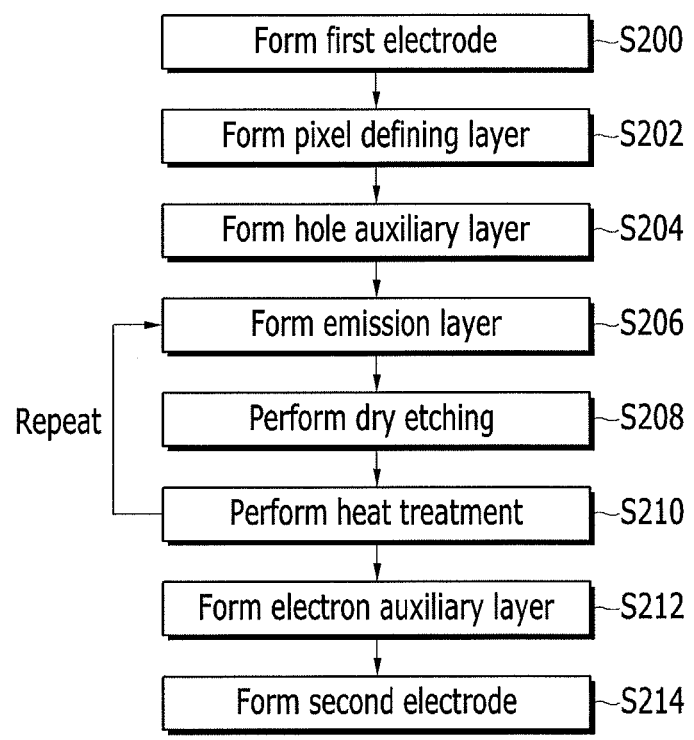
FIG. 8 is a flowchart provided for description of a manufacturing method of an OLED display according to another example embodiment.

FIG. 8 is a flowchart provided for description of a manufacturing method of an OLED display according to another example embodiment.

As shown in FIG. 8, a manufacturing method of an OLED display according to the present example embodiment includes forming a first electrode on a substrate (S200), forming a pixel defining layer on the first electrode (S202), forming a hole auxiliary layer (S204), forming an emission layer (S206), dry-etching (S208), performing heat treatment (S210), forming an electron auxiliary layer (S212), and forming a second electrode (S214).

The manufacturing method of the OLED display shown in FIG. 8 may generally be the same as the manufacturing method of the OLED display of FIG. 1, and hereinafter parts that are different will be described in detail.

The manufacturing method of the OLED display of FIG. 8 further includes performing heat treatment (S210). In the present example embodiment, the heat treatment is performed at a temperature that is higher than a glass transition temperature of the hole auxiliary layer.

When the OLED display is manufactured using the manufacturing method of FIG. 1, the hole auxiliary layer, e.g., a hole transport layer of hole auxiliary layer, disposed in a lower portion may be damaged at the surface thereof during elimination of the organic material in the dry-etching process.

Thus, the surface of the hole transport layer may be damaged due to the dry-etching so that the surface roughness may be increased. Such an increase of the surface roughness may cause a decrease of a light emission characteristic of an emission layer of a pixel and deterioration of a contact characteristic with another thin film.

Therefore, the heat treatment is performed in the present example embodiment to soften the hole auxiliary layer, and accordingly the surface roughness may be reduced, thereby helping prevent the deterioration of the contact characteristic and the decrease of the light emission characteristic.

In the present example embodiment, the emission layer and the hole auxiliary layer are formed in a manner that a softening temperature (glass transition temperature) $Tg1$ of the hole auxiliary layer and a softening temperature $Tg2$ of a light emitting organic material satisfy $Tg1<Tg2$ to prevent deterioration of the light emission characteristic due to the heat treatment.

Referring to FIG. 8, for the OLED display including the red pixel, the green pixel, and the blue pixel, the heat treatment may be performed for each of the respective pixels after forming an emission layer of each pixel.

Figure 9:
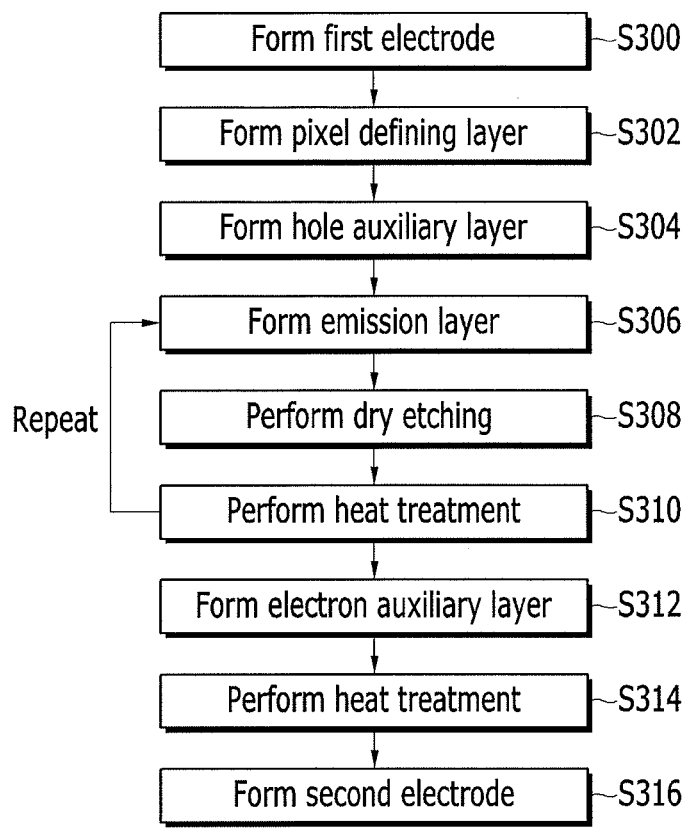
FIG. 9 is a flowchart provided for description of a manufacturing method of an OLED display according to another example embodiment.

FIG. 9 is a flowchart provided for description of a manufacturing method of an OLED display according to another example embodiment.

As shown in FIG. 9, a manufacturing method of an OLED display according to the present example embodiment includes forming a first electrode on a substrate (S300), forming a pixel defining layer on the first electrode (S302), forming a hole auxiliary layer (S304), forming an emission layer (S306), dry-etching (S308), performing a first heat treatment (S310), forming an electron auxiliary layer (S312), performing a second heat treatment (S314), and forming a second electrode (S316).

The manufacturing method of the OLED display shown in FIG. 9 may generally be the same as the manufacturing method of the OLED display of FIG. 8, and hereinafter parts that are different will be described in detail.

The manufacturing method of the OLED display of FIG. 9 includes the performing the first heat treatment (S310) and the performing the second heat treatment (S314). The first heat treatment (S310) may be the same as the heat treatment (S210) performed in the manufacturing method of the OLED display of FIG. 8, and therefore the performing the second heat treatment (S314) will be described in further detail. In an implementation, the first heat treatment (S310) may be omitted and the second heat treatment (S314) may be performed.

The second heat treatment is performed at a temperature higher than a glass transition temperature of the electron auxiliary layer. The surface of the emission layer may be damaged so that the surface roughness may be increased during the dry-etching. The increase of the surface roughness may cause deterioration of a close contacting property of the electron auxiliary layer formed in an upper portion with respect to the emission layer. However, the close contacting property of the electron auxiliary layer with respect to the emission layer may be increased by performing the second heat treatment as in the present example embodiment.

In this case, the emission layer, the hole auxiliary layer, and the electrode auxiliary layer are formed in a manner that a softening temperature $Tg1$ of the hole auxiliary layer, a softening temperature $Tg2$ of a light emitting organic material, and a softening temperature $Tg3$ of the electron auxiliary layer satisfy $Tg3<Tg1<Tg2$ to prevent deterioration of the light emission characteristic due to the second heat treatment.

Therefore, in the OLED display according to the example embodiment of FIG. 9, the surface roughness of the organic emission layer contacting the electron auxiliary layer may be greater than the surface roughness of the hole auxiliary layer contacting the electron auxiliary layer.

By way of summation and review, an OLED display may have an insertion-type structure in which an emission layer is interposed between an anode and a cathode to realize colors with a theory that light emission occurs from re-combination of holes and electrons emitted from the anode and the cathode in the emission layer. However, the level of efficiency of light emission therefrom may be difficult to improve to a desirable level when using such a structure. Thus, intermediate layers such as an electron injection layer (EIL), an electron transport layer (ETL), a hole transport layer (HTL), and a hole injection layer (HIL) may be selectively additionally formed between the respective electrodes and the emission layer.

In a flat display such as an organic light emitting diode (OLED) display, a vacuum deposition method may be used and thus material used as an organic material or an electrode forms a thin film on a flat plate by depositing the corresponding material in a vacuum condition. According to the vacuum deposition method, a substrate where an organic film is grown is disposed in the vacuum chamber, a deposition mask having a pattern that is the same as a pattern of a thin film to be formed is attached, and the organic material is vaporized or sublimated using a deposition source unit and thus deposited to the substrate.

However, permeation of the organic material may occur between the deposition mask and the substrate depending on a spray angle of the deposition material to the substrate, thereby causing a mixture between colors due to deposition of a light emitting material of another pixel to the neighboring pixel to which the organic material is permeated.

As described above, embodiments may provide an organic light emitting diode (OLED) display having high purity and high quality by preventing a mixture of colors due to a light emitting material of a neighboring pixel during forming an emission layer, and a manufacturing method thereof. Embodiments may provide a method of manufacturing an OLED display, including performing a first heat treatment and performing the second heat treatment. Embodiments may provide a method of manufacturing an OLED display in which the performing the first heat treatment may be omitted and the OLED display may be manufactured only by performing the second heat treatment. When the OLED display is manufactured according to a manufacturing method according to an embodiment, a mixture of colors due to deposition of a light emitting material of a neighboring pixel of each pixel may be prevented during forming of an emission layer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

| <Description of symbols> | |
|---|---|
| 100: substrate | 102: first electrode |
| 104: pixel defining layer | 200: hole auxiliary layer |
| 202R: red emission layer | 202G: green emission layer |
| 202B: blue emission layer | 300: deposition source |

What is claimed is:

1. A method of manufacturing an organic light emitting diode (OLED) display, the method comprising:
    forming a thin film transistor on a substrate;
    forming a first electrode electrically connected with the thin film transistor;
    forming a hole auxiliary layer on the first electrode;
    depositing an organic material on the hole auxiliary layer using a mask having an opening corresponding to the first electrode;
    forming an organic emission layer by partially eliminating the organic material through dry-etching, the dry-etching being performed to eliminate the organic material deposited outside of a boundary of the first electrode;
    forming an electron auxiliary layer on the organic emission layer; and
    forming a second electrode on the electron auxiliary layer.

2. The method as claimed in claim 1, further comprising, after the forming of the organic emission layer, performing heat treatment at a temperature higher than a softening temperature of the hole auxiliary layer and lower than a softening temperature of the organic emission layer.

3. The method as claimed in claim 2, further comprising, after the forming of the electron auxiliary layer, performing heat treatment at a temperature higher than a softening temperature of the electron auxiliary layer and lower than a softening temperature of the organic emission layer.

4. The method as claimed in claim 1, further comprising, after the forming of the electron auxiliary layer, performing heat treatment at a temperature higher than a softening temperature of the electron auxiliary layer and lower than a softening temperature of the organic emission layer.

5. The method as claimed in claim 1, wherein the organic emission layer includes a plurality of sub-emission layers respectively having different light emission colors, and the depositing of the organic material and the forming of the organic emission layer are iteratively performed for each color of the sub-emission layers.

6. The method as claimed in claim 5, wherein the colors of the sub-emission layers include red, green, and blue.

7. The method as claimed in claim 1, wherein the dry-etching is performed until the hole auxiliary layer is exposed outside of the boundary of the first electrode.

8. An organic light emitting diode (OLED) display, comprising:
    a substrate;
    a thin film transistor disposed on the substrate;
    a first electrode electrically connected with the thin film transistor;
    a hole auxiliary layer disposed on the first electrode;
    an organic emission layer disposed on the hole auxiliary layer;
    an electron auxiliary layer disposed on the organic emission layer; and
    a second electrode disposed on the electron auxiliary layer,
    wherein a surface roughness of the organic emission layer contacting the electron auxiliary layer is greater than that of the hole auxiliary layer contacting the electron auxiliary layer.

* * * * *